United States Patent [19]

Wolfinger

[11] 4,345,198
[45] Aug. 17, 1982

[54] GENERATOR AIR GAP ELECTRICAL TORQUE MONITOR

[75] Inventor: John F. Wolfinger, Schenectady, N.Y.

[73] Assignee: General Electric Company, Schenectady, N.Y.

[21] Appl. No.: 236,085

[22] Filed: Feb. 20, 1981

[51] Int. Cl.³ .................... G01R 31/00; H02H 7/06
[52] U.S. Cl. ............................ 322/25; 322/99; 324/158 MG; 361/20
[58] Field of Search .................................. 322/22–25, 322/99, 100; 361/20, 21; 324/158 MG

[56] References Cited

U.S. PATENT DOCUMENTS 3,662,251  5/1972  Smith ............................. 322/24 X
4,303,882  12/1981  Wolfinger ...................... 322/99 X

*Primary Examiner*—Robert J. Hickey
*Attorney, Agent, or Firm*—Ormand R. Austin; John F. Ahern

[57] ABSTRACT

Apparatus is disclosed for continuously monitoring the air gap torque acting on the rotor of a 3-phase electrical generator by sensing certain of the output voltages and currents produced by the generator as it supplies power to a connected load. In a preferred form of the invention, signals representing the three generator output voltages and two of the three line currents are conditioned and combined in electrical circuitry to produce a single output signal which is indicative of the air gap torque. The torque signal so produced is in a form easily handled by conventional means such as computers and recorders, and is appropriate for use by operating personnel in making decisions regarding generator operation.

9 Claims, 1 Drawing Figure

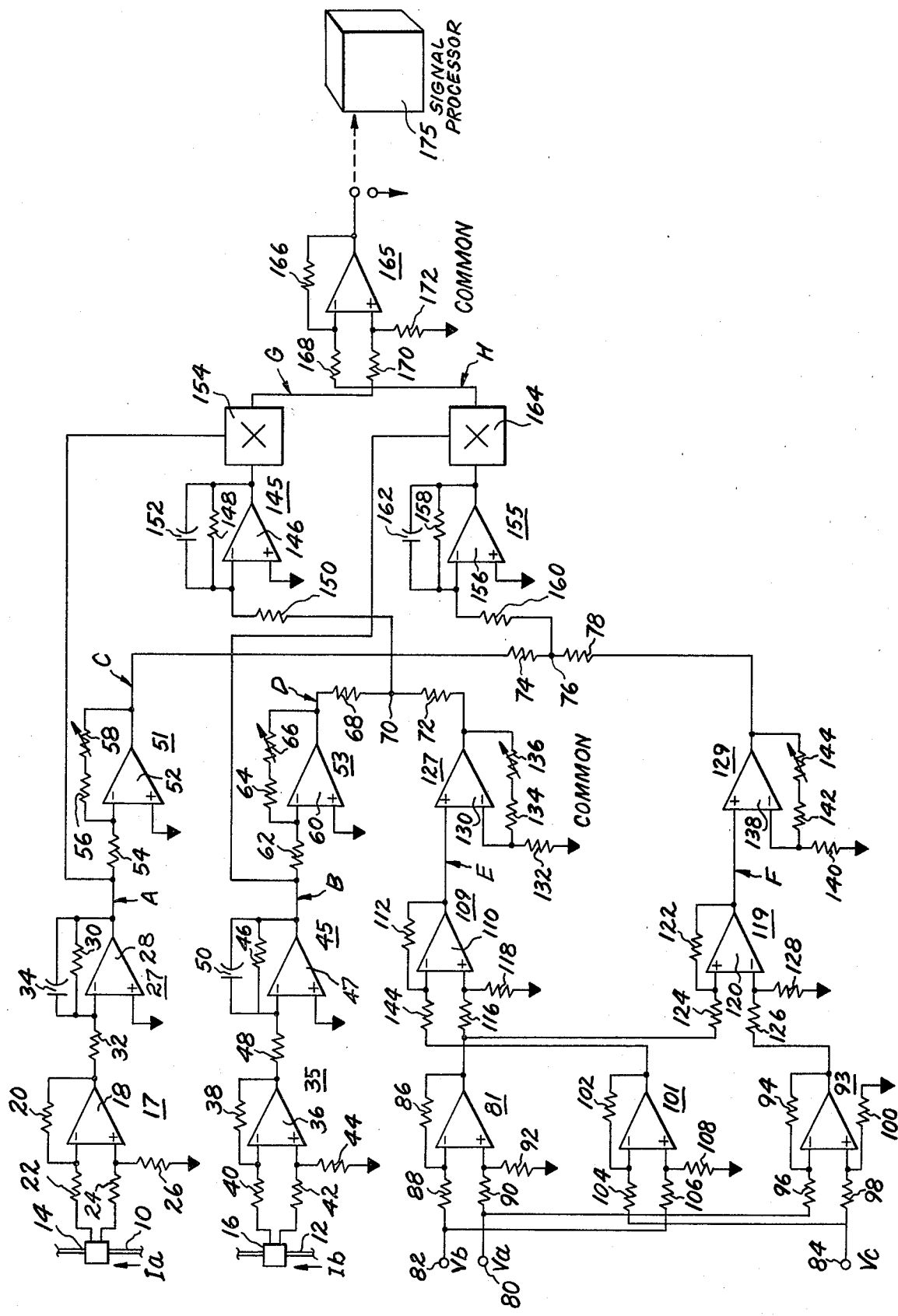

GENERATOR AIR GAP ELECTRICAL TORQUE MONITOR

BACKGROUND OF THE INVENTION

This invention pertains to the measurement of torque on rotating machinery and more particularly to apparatus for measuring the air gap torque acting on the rotor of an electrical generator.

Electrical power generators such as those in common use by the electric utility companies utilize a rotating magnetic field created by the field winding carried by the generator rotor. The magnetic field interacts with the stator armature winding in a well known manner to produce voltage and current which may be supplied to a load. Virtually all generators of this kind are 3-phase machines in which the output quantities are substantially equally separated in phase angle.

As the rotor turns, a torque is produced on the rotor, acting through the air gap that exists between the rotor and the stator, that results from the electromagnetic field interaction with the stator winding. This torque, frequently referred to as air gap torque, is proportional to the electrical power produced by the generator and inversely proportional to the rotor angular velocity.

The generator, of course, is designed to withstand all normal torque conditions and to have appropriate safety margins so that even short duration, transient torques of extreme magnitude do no immediate permanent damage to the machine. Very high levels of air gap torque can result, for example, from line faults such as line to ground or line-to-line short circuits on the power lines connected to the generator output terminals. The effects of these very high levels of torque are cumulative, however, so that over a long period of time in which a generator has sustained a number of such incidents, structural fatigue damage may ultimately be produced which forces the machine out of service.

It is an object of the present invention, therefore, to provide apparatus for continuously monitoring the resulting air gap torque on the rotor of a 3-phase generator by sensing certain of the output voltages and currents produced by the generator as it supplies power to a connected load. By these means it becomes possible to quantify the air gap torque under both normal and transient conditions and to use such torque information for predicting future machine outages and for deriving certain other information regarding past incidents of power line faults.

In a preferred form of the invention, signals representing the three generator output voltages and two of the three line currents are conditioned and combined in electrical circuitry to produce a single output signal which is indicative of the air gap torque acting on the generator rotor. The torque signal so produced is in a form easily handled by conventional means such as computers and/or recorders, and is appropriate for use by operating personnel in making decisions regarding generator operation.

BRIEF DESCRIPTION OF THE DRAWINGS

While the specification concludes with claims particularly pointing out and distinctly claiming the subject matter regarded as the invention, the invention will be better understood from the following description taken in connection with the accompanying drawing in which the sole FIGURE is a schematic circuit diagram of a preferred embodiment of apparatus according to the invention for monitoring the air gap torque produced on a 3-phase electrical power generator.

DETAILED DESCRIPTION OF THE INVENTION

It is well known in the field of electrical engineering that the so-called air gap torque, $T_e$, produced on the rotor of an electrical power generating unit is proportional to the power generated, P, and inversely proportional to the angular velocity, $\omega$, of the rotor. Mathematically this is simply stated as $$T_e = KP/\omega$$

where K is a constant of proportionality.

For a 3-phase generator, however, the air gap torque is also expressible in terms of the generator terminal quantities of current and voltage by the equation $$T_e = K_1[I_a \int (V_{ab} - V_{bc} - 3I_b R)dt - I_b \int (V_{ca} - V_{ab} - 3I_a R)dt]$$

where I represents load current; V represents output voltage; a, b, and c designate the three generator phases in a certain order; $K_1$ is a proportionality constant; and R represents the generator armature resistance, being substantially equal for all 3 phases. The integrations are, of course, with respect to time. This equation is a simplification from a more complicated equation and results from the fact that the sum of all three phase currents is at all times equal to zero.

A preferred form of apparatus according to the present invention for continuously monitoring air gap torque in a 3-phase generator and for producing a signal representation of such torque is illustrated in the drawing. This apparatus is generally based on the foregoing simplified equation. With respect to the drawing, it is to be understood that certain simplifications have been made to facilitate an explanation and understanding of the invention. For instance, although no source of operating power is illustrated it will be recognized that a dc supply or other power sources may be necessary to make the apparatus operational. Furthermore, component values are omitted since their selection is well within the ordinary skill of the art once an understanding of the principles of the invention is attained.

In the drawing, currents $I_a$ and $I_b$ are supplied to a load (not shown) by conductors 10 and 12 each connected at one end to the output terminals of a 3-phase generator (also not specifically shown). These currents, $I_a$ and $I_b$, are sensed by air core current transformers 14 and 16, respectively. Preferably, air core current transformers 14 and 16 are the type known in the art as Rogowski coils. The air core current transformers 14 and 16 have the advantage, as compared with more conventional current transformer means, of avoiding saturation and distortion of the current signal under the extreme overload conditions which can occur if a short occurs on one of the lines 10 and 12. In the drawing the subscripts a, b, and c refer to the three phases of the generator whose air gap torque is being monitored. The Rogowski coils (current transformers 14 and 16) each produce an output signal which is proportional to the time derivative of the currents $I_a$ and $I_b$. The signal indicative of the time derivative of $I_a$, for example, is first applied to an isolation network 17 including operational amplifier 18 and resistors 20, 22, 24 and 26. The gain of isolation network 17 is determined in a conventional manner by the relative resistance values of resistors 20, 22, 24 and 26.

The conditioned signal produced by isolation network 17, still representative of the time derivative of $I_a$, is applied to an integrator network 27 which includes operational amplifier 28, resistors 30 and 32, and capacitor 34. Since integrator 27 operates to integrate the input time derivative signal applied through resistor 32, the signal appearing at circuit point A is indicative of load current in the a phase of the generator being monitored; this load current is also that current flowing in line 10.

Similarly, the signal at circuit point B represents the load current in line 12 corresponding to the current from the b phase of the generator. It will be recognized that isolation network 35 including operational amplifier 36, resistors 38, 40, 42, and 44; and integrator network 45 including operational amplifier 47, resistors 46 and 48, and capacitor 50 are identical in function and circuit configuration to that described above for isolation network 17 and integrator network 27.

Thus the signals at circuit points A and B are indicative, respectively, of load currents from generator phases a and b. These load current signals are next applied to separate amplifier networks 51 and 53. Amplifier network 51 processes the signal from circuit point A; amplifier 53 processes the signal from circuit point B. Amplifier network 51 includes operational amplifier 52, fixed resistors 54 and 56, and adjustable resistor 58; amplifier network 53 includes operational amplifier 60, fixed resistors 62 and 64, and adjustable resistor 66. These networks, 51 and 53, function to invert the load current signals and to passively multiply them by constant factors equivalent to the network gain which is preselected to be proportional to the resistance of the armature winding of the generator being monitored. Adjustable resistors 58 and 56 allow the gain of each network 51 and 53 to be adjusted and therefore provide for precisely matching the gain to the armature resistance of the particular generator being monitored. The output signals, appearing at circuit points C and D, may be referred to herein as the first and second armature voltage drop signals, respectively. These signals are negative in polarity as a result of being inverted and are indicative, in a physical sense, of the voltage drop in the corresponding armature winding of the generator.

The second armature voltage drop signal is applied through summing resistor 68 to a first summing junction 70 and is there summed with a first difference signal arriving through summing resistor 72 and derived as will hereinafter be described; the first armature voltage drop signal is applied through summing resistor 74 to a second summing junction 76 and is there summed with a second difference signal arriving through summing resistor 78 and also derived as will hereinafter be described. It may be pointed out that since the armature voltage drop signals have been inverted they are of opposite polarity from the difference signals, so that in effect, the signals are subtracted from each other at the summing junctions 70 and 76. It will be recognized, of course, that the ratio of the resistance values of summing resistors 68 and 72 and of summing resistors 74 and 78 provides proper scale factors which are determined by the armature resistance.

The above-mentioned first and second difference signals are derived from the separate output voltages of the three phases of the generators which is under test. For example, representative values of the three phase voltages $V_a$, $V_b$, and $V_c$ are applied at input terminals 80, 82, and 84, respectively. $V_a$ and $V_b$ are applied to a first subtractor network 81 including resistors 86, 88, 90, and 92; $V_c$ and $V_a$ are applied to a second subtractor network 93 including resistors 94, 96, 98, and 100; $V_b$ and $V_c$ are applied to a third subtractor network 101 including resistors 102, 104, 106, and 108. These networks, 81, 93, and 101, provide output interphase voltage signals representing the difference between the output voltages of the generator, taken in each network 81, 93, and 101 as the difference between the two indicated input voltage signals.

The interphase voltage signal from the first subtractor 81 and the interphase voltage signal from the third subtractor 101 are applied as input signals to a fourth subtractor network 109 including operational amplifier 110 and resistors 112, 114, 116, and 118. The fourth subtractor network 109 provides the first difference signal mentioned above. This signal represents the difference between the first and third interphase voltage signals. The first difference signal appears at circuit point E.

In similar manner, a fifth subtractor network 119 including operational amplifier 120 and resistors 122, 124, 126, and 128 provides the above-mentioned second difference signal representing the difference between the second and first interphase voltage signals. The second difference signal appears at circuit point F.

To allow the first and second difference signals to be properly scaled in magnitude and also to provide signal buffering, buffer networks 127 and 129 are provided. Buffer 127 includes operational amplifier 130, fixed resistors 132 and 134, and adjustable resistor 136; buffer 129 includes operational amplifier 138, fixed resistors 140 and 142, and adjustable resistor 144. Adjustable resistors 136 and 144 allow the gain of each buffer 127 and 129, respectively, to be adjusted and the proper scale factor to be applied to the first and second difference signals. The first difference signal, from buffer 127, is applied through summing resistor 72 to first summing junction 70; the second difference signal, from buffer 129, is applied through summing resistor 78 to second summing junction 76. Thus, at first summing junction 70 a first summation signal is created representing the sum of the first difference signal and the second armature voltage drop signal; at second summing junction 76 a second summation signal is created representing the sum of the second difference signal and the first armature voltage drop signal.

The first summation signal, from first summing junction 70 is applied to a first final integration network 145 which includes operational amplifier 146, resistors 148 and 150, and capacitor 152. The output of this network 145, in the form of a first final integration signal, is applied as one input to first analog multiplier 154 wherein the signal is multiplied by the load current signal (for the a phase) taken from circuit point A and applied as the second input to analog multiplier 154. The output of multiplier 154 is a first composite signal and it appears at circuit point G. The analog multipliers herein described are active devices of a type known in the art to provide the product of two input signals.

The second summation signal, from second summing junction 76 is applied to a second final integration network 155 which includes operational amplifiers 156, resistors 158 and 160, and capacitor 162. The output signal of integrator network 155, referred to herein as the second final integration signal, is applied to one input of second analog multiplier 164 and is therein multiplied by the load current signal from circuit point B which is received by multiplier 164 as its second input. The output of analog multiplier 164 is a second composite signal and it appears at circuit point H.

Finally, to arrive at a signal representing the air gap torque produced on the rotor of the generator being monitored, the first and second composite signals are brought together in a final subtractor network 165. This network 165 includes resistors 166, 168, 170, and 172 in a conventional configuration. The air gap torque signal, produced by subtracting the second composite signal from the first composite signal, is in a form suitable for handling by any conventional and appropriate means and may be graphically recorded or displayed (such as by a cathode ray tube indicator). The signal may also, with appropriate signal conditioning, be provided for utilization by computing equipment. All such means are generally indicated in the drawing by signal processor 175.

While the present invention has been disclosed in connection with the preferred embodiment thereof, it should be understood that there may be other embodiments which fall within the spirit and scope of the invention as defined by the following claims.

The invention claimed is:

1. In combination with a 3-phase electrical generator supplying output voltage and current to a load and having armature windings of known resistance, apparatus for continuously monitoring the air gap torque acting on the rotor of the generator, comprising:

first means providing a first load current signal indicative of load current in a first phase of said generator;

second means providing a second load current signal indicative of load current in a second phase of said generator;

first means providing a first armature voltage drop signal indicative of armature voltage drop in said first phase;

second means providing a second armature voltage drop signal indicative of armature voltage drop in said second phase;

first subtractor means providing a first interphase voltage signal representing the difference between the output voltage of said first phase and the output voltage of said second phase;

second subtractor means providing a second interphase voltage signal representing the difference between the output voltage of a third phase of said generator and the output voltage of said first phase;

third subtractor means providing a third interphase voltage difference signal representing the difference between the output voltage of said second phase and the output voltage of said third phase;

fourth subtractor means providing a first difference signal representing the difference between said first interphase voltage signal and said third interphase voltage signal;

fifth subtractor means providing a second difference signal representing the difference between said second interphase voltage signal and said first interphase voltage signal;

first summing means for summing said first difference signal and said second armature voltage drop signal to provide a first summation signal, said first difference signal and said second armature voltage drop signals being of opposite polarity;

second summing means for summing said second difference signal and said first armature voltage drop signal to provide a second summation signal, said second difference signal and said first armature voltage drop signals being of opposite polarity;

first final integrator means for integrating said first summation signal to provide a first final integration signal;

second final integrator means for integrating said second summation signal to provide a second final integration signal;

first multiplier means for multiplying said first final integration signal by said first load current signal to provide a first composite signal;

second multiplier means for multiplying said second final integration signal by said second load current signal to provide a second composite signal;

final subtractor means for subtracting said second composite signal from said first composite signal to produce an air gap torque signal representative of electrically produced torque on the generator rotor; and means for presenting said air gap torque signal to operating personnel.

2. The combination of claim 1 wherein said first and said second means providing said first and said second load current signals, respectively, are air core current transformers.

3. The combination of claim 1 wherein said first and said second means providing said first and said second load current signals, respectively, each includes a Rogowski coil current transformer providing a signal indicative of the time derivative of load current; an integrator network for integrating said time derivative signal; and a buffer network electrically isolating said Rogowski coil from said integrator network.

4. The combination of claims 1, 2, or 3 wherein:

said first means providing a first armature voltage drop signal comprises a third multiplier means for multiplying said first load current signal by a factor proportional to said armature resistance to produce said first armature voltage drop signal; and said second means providing a second armature voltage drop signal comprises a fourth multiplier means for multiplying said second load current signal by a factor proportional to said armature resistance to produce said second armature voltage drop signal.

5. The combination of claim 4 wherein said third and fourth multiplier means each comprises an operational amplifier network whose gain is proportional to said armature resistance.

6. The combination of claim 5 wherein said first, second, third, fourth, and fifth subtractor means each comprises an operational amplifier circuit configured to provide the difference between two input signals.

7. The combination of claim 6 wherein said first and said second final integrator means each comprises an operational amplifier circuit configured as an integrator network.

8. The combination of claim 7 wherein said first and said second multiplier means each comprises an analog multiplier.

9. The combination of claim 8 wherein said final subtractor means comprises an operational amplifier circuit configured as a subtractor network.

* * * * *